United States Patent
Cellier et al.

[11] Patent Number: 5,884,269
[45] Date of Patent: Mar. 16, 1999

[54] LOSSLESS COMPRESSION/ DECOMPRESSION OF DIGITAL AUDIO DATA

[75] Inventors: Claude Cellier, Chexbres, Switzerland; Pierre Chênes, Ferreyres, Switzerland

[73] Assignee: Merging Technologies, Puidoux, Switzerland

[21] Appl. No.: 422,457

[22] Filed: Apr. 17, 1995

[51] Int. Cl.⁶ .............................. G10L 7/00; G10L 3/02
[52] U.S. Cl. .................. 704/501; 704/504; 371/37.8; 341/64
[58] Field of Search ................... 395/2.38, 2.39, 395/2.3–2.32; 375/242, 243, 254; 371/30, 37.1, 37.2, 37.7, 37.8; 382/56; 358/246, 261.1, 261.2, 427; 704/200, 500, 501, 503, 504; 341/50, 51, 64, 65

[56] References Cited

U.S. PATENT DOCUMENTS

| | | | |
|---|---|---|---|
| 4,396,906 | 8/1983 | Weaver | 340/347 |
| 4,449,536 | 5/1984 | Weaver | 128/696 |
| 4,503,510 | 3/1985 | Weaver | 364/715 |
| 4,535,320 | 8/1985 | Weaver | 340/347 |
| 4,546,342 | 10/1985 | Weaver et al. | 340/347 |
| 4,754,483 | 6/1988 | Weaver | 381/36 |
| 4,802,222 | 1/1989 | Weaver | 381/35 |
| 4,841,299 | 6/1989 | Weaver | 341/36 |
| 4,882,754 | 11/1989 | Weaver et al. | 381/35 |

OTHER PUBLICATIONS

C. Cellier et al., "Lossless Audio Data Compression for Real Time Applications," 95th AES Convention, Oct. 1993.

*Primary Examiner*—Chi H. Pham
*Assistant Examiner*—Ricky Q. Ngu
*Attorney, Agent, or Firm*—Kenyon & Kenyon

[57] ABSTRACT

An audio signal compression and decompression method and apparatus that provide lossless, realtime performance. The compression/decompression method and apparatus are based on an entropy encoding technique using multiple Huffman code tables. Uncompressed audio data samples are first processed by a prediction filter which generates prediction error samples. An optimum coding table is then selected from a number of different preselected tables which have been tailored to different probability density functions of the prediction error. For each frame of prediction error samples, an entropy encoder selects the one Huffman code table which will yield the shortest encoded representation of the frame of prediction error samples. The frame of prediction error samples is then encoded using the selected Huffman code table. A block structure for the compressed data and a decoder for reconstructing the original audio signal from the compressed data are also disclosed.

14 Claims, 7 Drawing Sheets

LOSSLESS COMPRESSION/ DECOMPRESSION OF DIGITAL AUDIO DATA

FIELD OF THE INVENTION

The present invention relates to an apparatus and method for digitally compressing and decompressing audio signals. More specifically, the present invention relates to an apparatus and method for the lossless compression and decompression of digital audio data.

BACKGROUND INVENTION

Sampled digital audio data, from sources such as speech or musical instruments, particularly in the form of linear Pulse Code Modulation (PCM) samples, tends to include a high degree of redundancy because of the high degree of dependence between successive sample values.

With the proliferation of multimedia applications, several compression/decompression algorithms have been promoted. U.S. Pat. No. 4,396,906 to Weaver describes a system which includes means for digitizing analog signals, for compression filtering the digital samples, and for Huffman encoding the compressed digital samples for recording or transmission. The U.S. Pat. No. 4,396,906 patent also describes a receiving system which includes a Huffman decoder, a digital reconstruction filter and means for converting the decoded, reconstructed digital signals back to analog form. A similar system is describe in an article by U. E. Ruttimann et al., entitled "Compression of the ECG by Prediction or Interpolation and Entropy Encoding", *IEEE Transactions on Biomedical Engineering*, Vol. BME-26, No. 11, November 1979, pp. 613–623. Another system is described in an article by K. L. Ripley et al., entitled "A Computer System for Capturing Electrocardiographic Data", *Pro. Comput. Cardiol.*, 1976, pp. 439–445.

To achieve constant compression rates, however, existing schemes have sacrificed audio integrity, losing some of the information contained in the original audio signal. There are lossless compression algorithms which have been used to compress text and data files with completely accurate recovery of the primary data upon decompression. These techniques, however, are optimized for text and data and are only marginally effective in compressing audio data.

Some methods of audio compression are based on psychoacoustics. Such perceptual coding algorithms drop psychoacoustically imperceptible audio information. While acceptable for most consumer audio delivery formats, such as MiniDisc, DAT and CD-ROMs, such an approach is inadequate for professional audio production, where material may go through multiple iterations of compression and decompression before being mastered onto the final delivery medium. Any loss of audio information is compounded with each iteration causing a serious compromise in the audio integrity of the finished product. There clearly exists a need for a truly lossless, realtime compression technology.

SUMMARY OF THE INVENTION

The present invention provides an apparatus and method of compressing and decompressing digital audio data in realtime, while being lossless.

In accordance with the present invention, digital audio samples are first applied to a digital compression filter or predictor in order to reduce the correlation between samples, while simultaneously reducing the average variance over a block of samples. The error output of the predictor, i.e., the difference between the actual sampled value and the predicted value for that sample, is then provided to an entropy encoder, which can be based on a Huffman or arithmetic coding scheme, to encode digital audio samples into a compressed form using code words of varying length.

An object of the present invention is to provide a highly efficient and compact way of mapping the statistics of the actual audio signal, on a block basis, in order to select the optimum encoding table from a number of different preselected tables which have been tailored to different probability density functions (PDFs) of the predictor error. It has been discovered that the long-term statistics of the prediction error of commonly used predictors follow a Laplacian distribution. For each block of audio data, the entropy encoder of the present invention selects one of a number of encoding tables, each of which closely matches a Laplacian distribution with a given variance. The encoding tables correspond to a series of Laplacian distributions whose variances are in a geometric progression.

While an ideal matching to each PDF would suggest a different probability for each value, such an implementation, for a 16-bit signal, would require 64K entries for each encoding table. In accordance with the present invention, the range of possible values is divided into sub-ranges or "bins" with boundaries at integer powers of two, with each bin having one entry in each encoding table. As a result, the number of entries per table is only n+1, where n is the number of bits of the predictor error signal to be encoded. Each Huffman encoding table includes a prefix code for each of the n+1 bin entries. Each Huffman table will yield a minimum coding length for a different bin and as such will yield a different coding cost depending on the variance of the predictor error values over a frame. The Huffman table having the lowest coding cost for each frame is selected and used to encode the predictor error values for that frame.

Another object of the present invention is to provide an efficient and flexible compressed data file format. In accordance with the present invention, compressed audio data is organized in blocks having a header and a body of user data, i.e., the encoded audio data. The start of each block is delimited by a unique sync word in the header. Each of the variable-length codes in the encoding tables are of such a format that they can be combined in any order without forming the same pattern as the unique code that is used for the sync word in the block header. This feature adds a level of error detection making it possible to prevent the propagation of an error beyond the frame in which the error occurred. The use of a unique sync word also allows for easy synchronization of a random access system fetch to an arbitrary location in a compressed audio data file and for subsequently quickly initializing and synchronizing the decoding process of the following frame.

The block header structure in accordance with the present invention also provides a means of rapidly jumping forward to the following block header, or backwards to the preceding block header, by indicating the size of the compressed block. Each block header also optionally includes a Sample Address Count (SAC) element to help identify the current block of data during a random access.

The block header data can also be stored in a separate file that can be used to facilitate the search for a specific location in a compressed audio file. This feature is particularly helpful in conjunction with lossless compression which inherently provides a variable rate of compression and thus prohibits the use of a simple search or seek routine through a linearly mapped storage medium. In accordance with the present invention, the contents of each block is organized so as to only minimally add to the overhead of the compressed data.

With the present invention, compression ratios better than 3:1 are possible, depending on the uncompressed audio source material, while the reconstructed output data is bit-for-bit identical to the original uncompressed audio data. As such, unlike with known methods and apparatus, audio data can go through an unlimited number of compression and decompression cycles with no distortion or loss of data integrity.

DETAILED DESCRIPTION OF THE DRAWING

Figure 1:
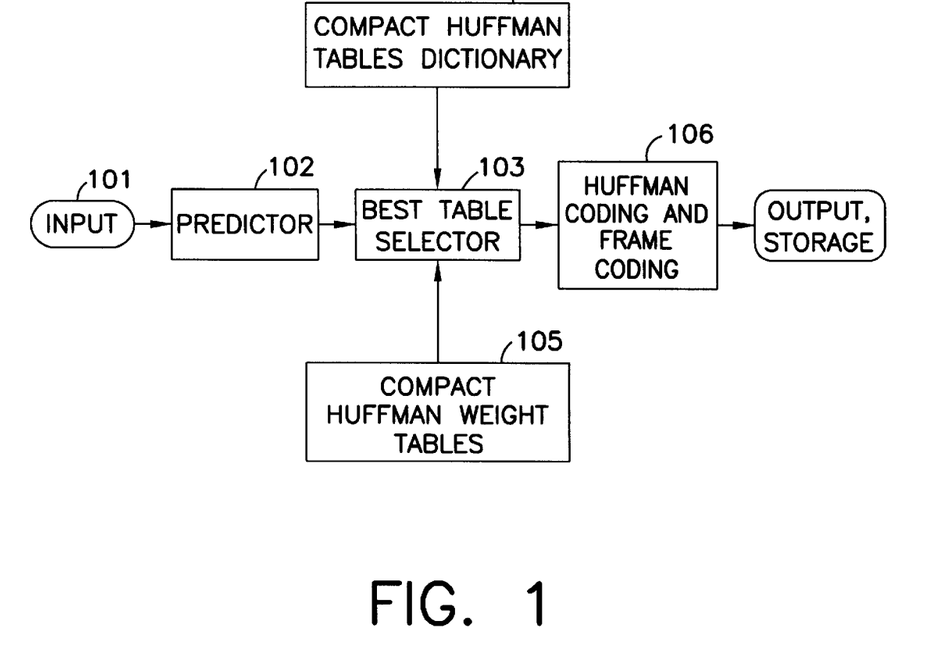
FIG. 1 is a block diagram of a lossless audio data compression encoder in accordance with the present invention.

FIG. 1 shows a block diagram of an audio data compression encoder in accordance with the present invention. In the exemplary embodiment of the encoder of FIG. 1, digital audio data organized as a serial sequence of audio samples grouped in frames is serially input to the encoder at an input 101. A frame of input digital audio samples is any suitable sequence of audio samples from which the encoder extracts relevant statistics (described below) in order to optimize the coding process. A frame of 1152 samples (which is the same length used in the MPEG L-II audio coding process) provides a good compromise between coding delay and the ability to track varying audio statistics. The coding efficiency of the encoder of the present invention has been found to be relatively constant over a range of frame lengths of 512 to 2048 samples. For frame lengths below 512 samples, framing overhead becomes a factor in reducing coding efficiency. For frame lengths longer than 2048 samples, coding efficiency for rapidly changing input audio sample streams will tend to suffer.

Upon input to the encoder of the present invention, the input audio data is provided first to a predictor (or prediction filter) 102. Using previous audio samples, the predictor 102 generates a prediction of the current audio sample and provides at its output the difference between the actual sample and the predicted value, also referred to as the prediction error. The predictor 102 thus serves to remove the redundancy between consecutive audio samples, thereby narrowing the probability density function of the prediction error about zero. The predictor 102 can also be thought of as a filter that is optimized to output only the unpredictable components of the input audio signal. The general expression for the function of a predictor is as follows:

$$e(n) = x(n) - \sum_{j=1}^{N} h_j x(n-j)$$

where x(n) are the input audio sample values, e(n) are the corresponding prediction error sample values and $h_j$ are the prediction filter coefficients.

Various implementations of the predictor 102 can be used in the encoder of the present invention. The filter coefficients $h_j$ can either be fixed, as in a simple finite impulse response (FIR) filter, or can vary as a function of the original signal x(n), as in a forward adaptive prediction filter, or as a function of the predicted signal x' (n), as in a backward adaptive prediction filter. The predictor 102 can also be implemented as an array of fixed FIR filters with a selector to select the filter providing the best prediction error for a given frame. In this case, however, a reconstruction filter must be informed of which filter was used to encode a particular block of audio data. This information can be provided in a block header. The predictor 102 can also be designed as a hybrid fixed FIR/adaptive implementation; i.e., the predictor 102 can switch between a fixed FIR filter or an adaptive filter to process a given block of audio data depending on which of the two would yield a better prediction. As in the case of multiple fixed FIR filters, some indication must be provided to the reconstruction filter as to whether the fixed FIR or adaptive filter was used to encode a given block of audio data. It should be clear that there is no need to provide any such information in a single filter implementation (whether fixed coefficient or adaptive), in which there is no switching between different filters.

An FIR filter with fixed coefficients has the advantage of being implemented with a DSP with few instructions. Although the adaptive implementations will provide better prediction performance and thus better compression, they are more complex, requiring more instructions and storage space. In an exemplary embodiment of the present invention, the predictor 102 is implemented as a dual-FIR design in which the predictor selects between two different fixed FIR filters depending on which provides better performance. The first filter has three coefficients: $h_0=3$, $h_{-1}=-3$ and $h_{-2}=1$; while the second filter has two coefficients: $h_0=1.5$ and $h_{-1}=-0.5$. A bit in the header of each block of compressed audio data is used to indicate to the decoder the filter that was used to encode the audio data.

As shown in FIG. 1, the prediction error output of the predictor 102 is provided to an entropy coding block comprised of a best table selector 103, a compact Huffman tables dictionary 104 and compact Huffman weight tables 105. For each frame of input audio data, the best table selector 103 selects one of a plurality of Huffman tables stored in the compact Huffman tables dictionary 104 on the basis of a minimum cost search. In other words, the table selector 103 selects that Huffman table which when used to encode the current frame of error samples will yield the most compact encoded representation. The best table selector 103 performs the minimum cost search by using the compact Huffman weight tables 105 to determine, for each entry or "bin" in each Huffman table, an encoding "cost" in terms of the number of code bits needed to represent the prediction error samples falling within each bin. The operation of the best table selector 103 and the contents of the Huffman ode and weight tables will be described in greater detail further below.

Once the selector 103 has selected the best Huffman table for a given frame, the prediction error values of the frame are encoded by a Huffman coding and frame coding block 106.

The coding block 106 encodes each prediction error sample with a corresponding codeword stored in the Huffman table selected by the selector 103 from the table dictionary 104. In addition to encoding each error sample with a Huffman table codeword, the coding block 106 also forms each frame of encoded error samples into a block by appending thereto a header which includes a unique block sync bit pattern, an indication of the Huffman table used to encode the error samples in that block and other information described further below. As such, the coding element 106 generates at its output blocks of compressed audio data which can then be stored, transmitted, etc. and later decoded to recreate the original uncompressed audio data stream. To facilitate storage and retrieval, the coding block 106 appends a number of bits to the end of the encoded audio data bitstream of each block in order to align all consecutive block headers on byte boundaries or a multiple thereof. In the exemplary embodiment of FIG. 1, block headers are aligned on 32-bit (or 4 byte) boundaries in order to accommodate many current generation processors which handle 32-bit data. The format and contents of each block of encoded audio data will be described in greater detail below.

Figure 2:
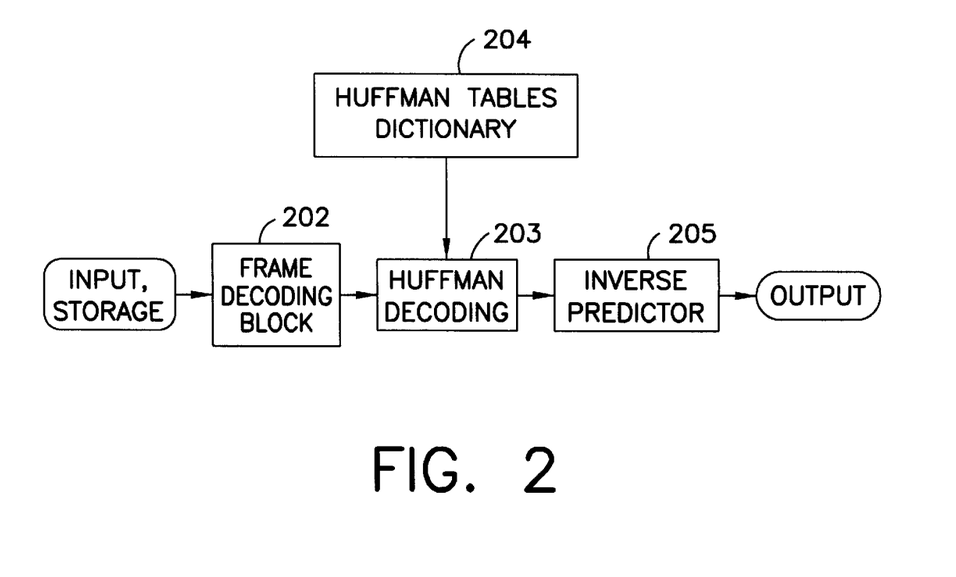
FIG. 2 is a block diagram of a decoder of compressed audio data in accordance with the present invention.

FIG. 2 shows a decoder in accordance with the present invention for decoding the audio data encoded with the encoder of FIG. 1 to generate an exact recreation of the original audio data. The encoded data, which is provided serially to the decoder for example from a storage device or by transmission, is first processed by a frame decoding block 202. The decoding block 202 first scans the incoming bit stream for a valid sync pattern delimiting the start of a block. By ensuring that each block starts at a 32-bit boundary, the process of scanning the incoming bit stream for a sync pattern is appreciably accelerated. Once a sync pattern has been detected, the decoding block 202 determines, from the header information, the Huffman table that was used to encode the frame of compressed audio data within the block currently being decoded. The decoding block 202 also reads any ancillary information included in each block of incoming data.

The frame decoder 202 outputs to a Huffman decoder 203 the compressed audio data and the identity of the encoding Huffman table for each block of compressed audio data received. Using the identity of the encoding Huffman table, the Huffman decoder 203 retrieves the appropriate Huffman table from a Huffman tables dictionary and uses the retrieved table to convert the encoded bitstream of compressed audio data in the current block back into prediction error samples. The decoded prediction error samples are then provided to an inverse predictor (or inverse prediction filter) 205 which adds each error sample to a corresponding predicted sample value to recreate each actual audio data sample. The operation of the inverse predictor will not be described in further detail since it should be well known to a person of ordinary skill.

The operation of the encoder of the present invention will now be described in greater detail.

Figure 3:
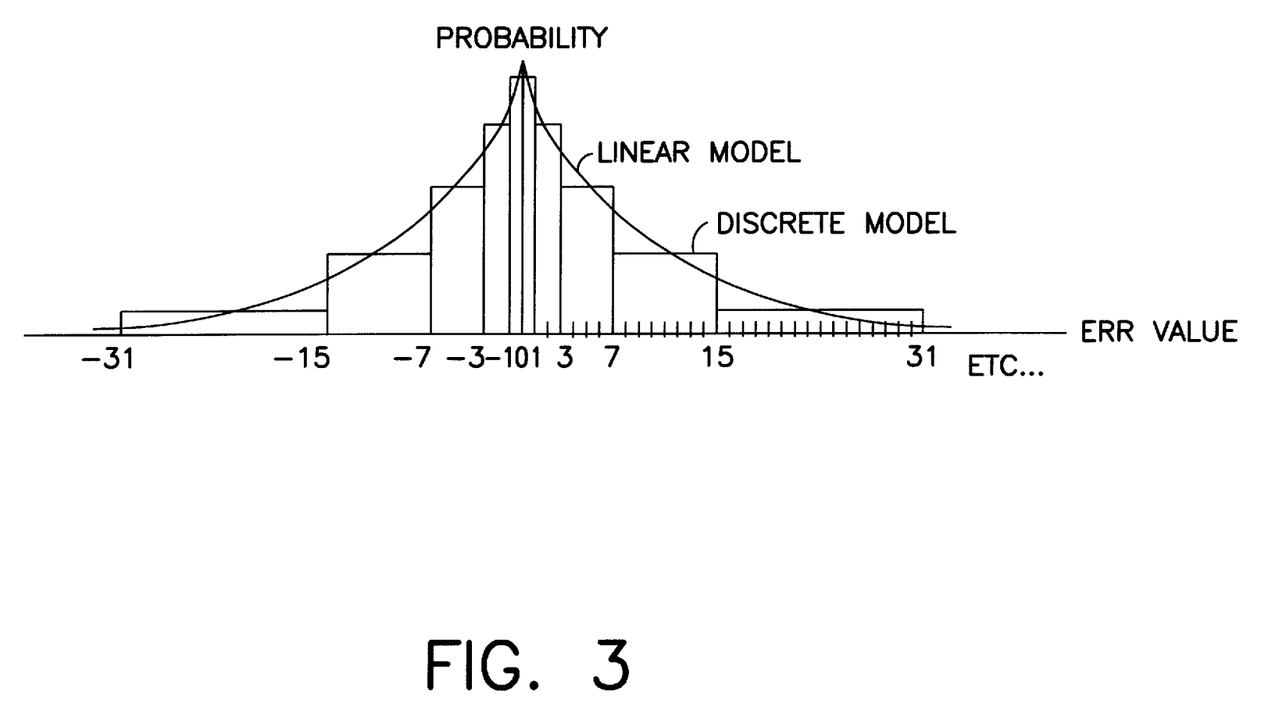
FIG. 3 is a graph of the probability density function of the prediction error of a predictor of the encoder of the present invention.

It has been determined that the prediction error output of the predictor 102 of the encoder of FIG. 1 exhibits a Laplacian probability density function (pdf) expressed as follows:

$$p(x) = Ae^{-\frac{k}{\sigma}|x-\mu|}$$

with $$A = \frac{k}{2\sigma e^{\frac{k\mu}{\sigma}}}$$

and where $\sigma$ is the estimated standard deviation of the pdf, $\mu$ is the estimated mean and k is a parameter which can be used to tailor the pdf to the type of audio signal represented. For example, it has been determined that a value of k of approximately 1.1 minimizes the mean quadratic error between the model and the actual measured signal for music, whereas a value of 1.7 is better suited for voice. A continuous representation of the probability density function of the prediction error is shown as the smooth curve in the graph of FIG. 3.

In accordance with the encoding method of the present invention, prediction error values that have a high probability of occurrence are encoded using shorter codes, while prediction error values with a low probability of occurrence are encoded using longer codes. In other words, the encoding method of the present invention tracks the entropy of the input audio signal by assigning codes of length inversely proportional to the probability of occurrence of the prediction error value to which each code is assigned.

In an exemplary embodiment in which the input audio signal is quantized into 16-bit samples, each sample could take on a value between −32768 and +32767. The probability of occurrence of each value is different. This is even more true of the prediction error of a prediction filter operating on the input audio samples. The most probable prediction error values will be grouped around zero, with the probability density exponentially decreasing for larger values, as shown by the Laplacian distribution of FIG. 3. In an ideal system, a different codeword length can be selected for each of the $2^{16}$ possible values of the prediction error samples. Such a system, however, would require much memory in order to store all the possible code values and require much processing time in order to select the optimal code for each sample.

The method and apparatus of the present invention drastically reduces the number of different codeword entries in each Huffman table while closely tracking the probability of occurrence of each error sample value over the entire range of possible error sample values. In accordance with the present invention, error sample values are grouped into groups of values or "bins". In each Huffman table, each bin has a corresponding codeword prefix entry. In other words, all error sample values falling within the same bin will have the same codeword prefix. The prefix is placed before a suffix representing the magnitude of the error sample value. Moreover, all error sample values falling within the same bin will have the same encoded length.

The bins are defined by sub-dividing the entire range of error sample values into unequal size sub-ranges having boundaries at successive powers of 2. This sub-division is illustrated in FIG. 3 by the discrete model of the Laplacian probability density function. Furthermore, since the probability density function of the error sample distribution is essentially symmetrical about zero, a further simplification is achieved by grouping positive and negative values with the same absolute value into the same bin. In the exemplary embodiment, the first bin is assigned to the value 0, the second bin to the values −1 and +1, the third bin to the values −3, −2, +2 and +3, the fourth bin to the values −7 to −4 and +4 to +7, etc., with the second-to-last bin assigned to the values −32767 to −16536 and +16536 to +32767 and the last bin assigned to the value −32768. It should be clear that the definition of bins can be readily adapted to any quantization resolution such as 8, 18 or 20-bit audio. For a quantization resolution of n bits, the number of bins, and thus the number of entries in each Huffman table, will be n+1. Thus for 16-bit audio, each Huffman table will have 17 entries. It should be noted that the sizes of selected bins can be varied to fine tune the encoding process. For example, the bin for absolute values between 128 and 255 can be sub-divided into one bin from 128 to 195 and a second bin from 196 to 255. Although sub-dividing bins provides even better fine tuned code lengths, the cost is slightly greater processing complexity and memory requirements.

As the probability density function of an audio signal varies from frame to frame, the encoder of the present invention tracks the varying statistics by selecting, for each frame, a Huffman table that is optimal for the probability density function of each frame. For predictable audio signals, most prediction error sample values will fall in the first few bins about zero with very few, if any, values falling in the higher bins. For unpredictable audio signals, such as noisy signals, the prediction error sample values will be more evenly spread over all bins. Although the probability density function will vary from frame to frame, it will nonetheless have a Laplacian form and will be centered substantially about zero. What will vary appreciably, however, is the variance of the Laplacian probability density function. To account for the varying statistics of the input audio signal, an exemplary embodiment of the encoder of the present invention uses 15 different Huffman tables, with each table corresponding to a different variance of the probability density function. A listing of the Huffman tables is included in the Appendix hereto. The 15 Huffman tables used in the exemplary embodiment are geometrically spaced to correspond to standard deviations ranging from 1 to 5000.

The contents of each Huffman table will now be described with reference to the Huffman tables listed in the Appendix. In a given Huffman table, each of the 17 bins 0–16 (assuming 16-bit quantized audio) is assigned a unique prefix code. The encoded representation of each error sample is comprised of the prefix for the bin in which the sample falls and a suffix. The suffix indicates the relative position of the sample within the bin and the sign of the sample. In accordance with the present invention, the prefix codes for each table are selected so that the length of encoded error samples within a bin corresponds inversely to the probability that an error sample falls within the bin.

It will be noticed from the Huffman tables listed in the Appendix that each prefix code includes at least one "0" bit. This guarantees that the bitstream generated by the Huffman coder will never include a bit pattern that can be misinterpreted for the sync pattern (in the block header) which consists of 32 consecutive "1" bits.

It should also be observed that the maximum length of any prefix in any table does not exceed 16 bits. This feature makes it possible to store each table entry in no more than two bytes of memory. Thus for the exemplary embodiment of the encoder of the present invention for 16-bit audio samples, the entire Huffman tables dictionary 104 can be stored in 510 bytes (i.e., 15 tables×17 entries×2 bytes/entry).

Figure 4:
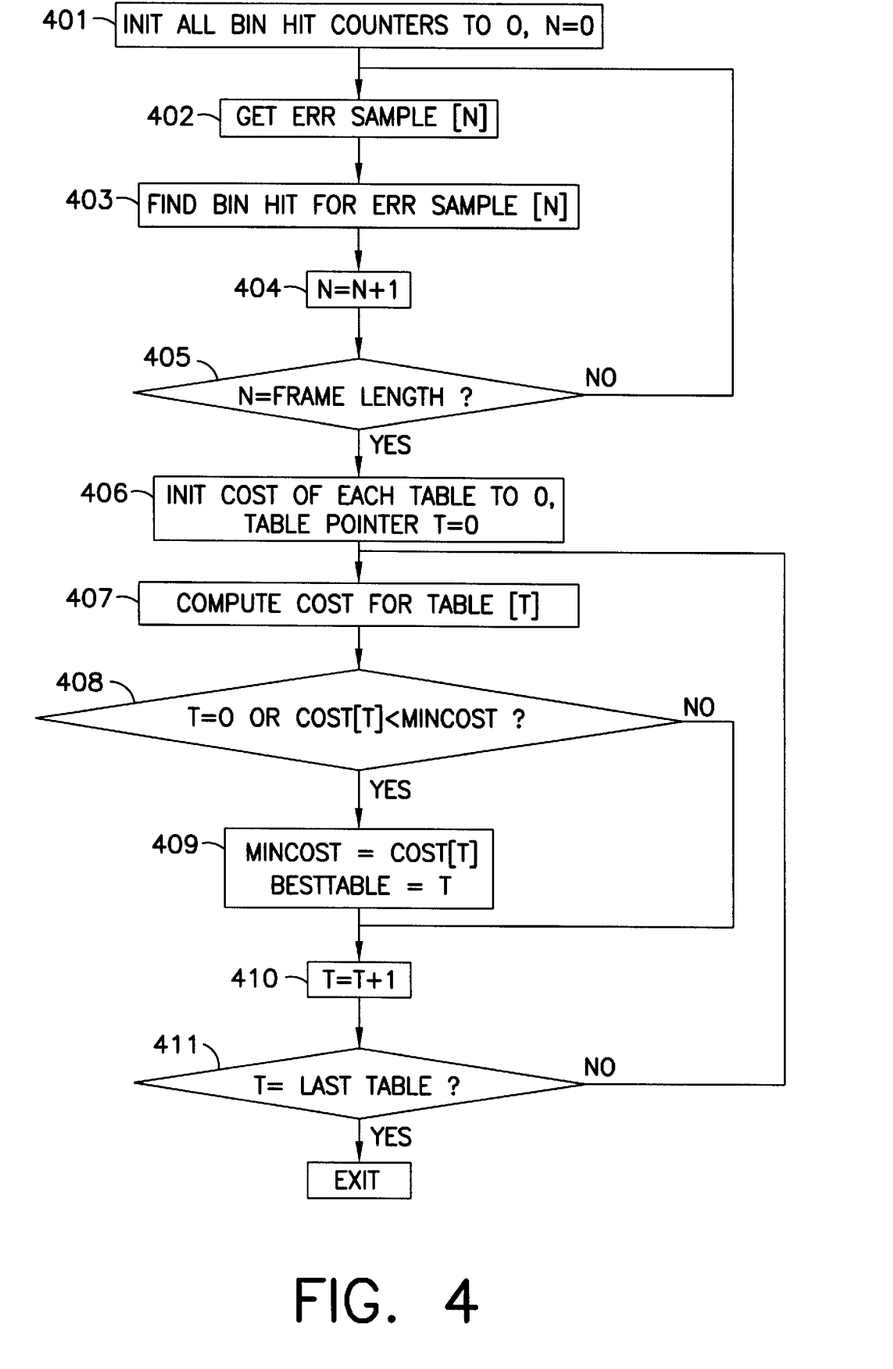
FIG. 4 is a flow-chart of a method for selecting a Huffman encoding table in accordance with the present invention.

FIG. 4 is a flow-chart describing the operation of the best table selector 103. As discussed above, the selector 103 selects, for each frame of error sample values, the one Huffman table which can be used to encode the frame most efficiently.

Operation of the best table selector begins at step 401 in which a set of bin hit counters and a sample counter N are initialized to 0. There are 17 bin hit counters, one for each bin, that are used to count the number of prediction error samples falling within each bin. At step 402, the table selector 103 fetches an error sample output from the predictor 102. At step 403, a search of the 17 bins is conducted to determine in which bin the current error sample falls. In step 403, the bin hit counter of the bin in which the current error sample falls is incremented. Step 403 is described in greater detail below in conjunction with FIGS. 5(A) and 5(B). At step 404, the sample counter is incremented and at step 405, it is determined whether the sample count N is equal to the frame length (i.e., the number of error samples in each frame). If the sample count N is not yet equal to the frame length, operation loops back to step 402 and steps 402–405 are repeated. If it is determined in step 405 that the sample count N is equal to the frame length, operation continues to step 406. At this point, a frame of error samples has been read in and a distribution of the error samples over the 17 bins has been determined in terms of the number of error samples falling within each bin, as represented by the contents of the 17 bin hit counters.

At step 406, a set of cost variables, one variable for each of the 15 Huffman tables, and a table pointer T are initialized to zero. Operation then proceeds to step 407 in which the coding cost of a Huffman table (indexed by the pointer T) is determined using the set of 17 bin hit counts determined above. The coding cost associated with a Huffman table is the number of bits required to encode the current frame using that table. Step 407 is described more fully below in conjunction with FIG. 6. Operation then proceeds to step 408 in which it is determined whether T=0 or whether the coding cost of the table currently under consideration is less than a variable MINCOST. MINCOST is the lowest coding cost to be calculated of the tables that have been considered so far. If it is determined in step 408 that T=0 or that the coding cost of the currently considered table is less than MINCOST, operation proceeds to step 409 in which MINCOST is set to the coding cost of the currently considered table and a variable BESTTABLE, indicating the best table determined so far, is set to T, the current table pointer value. Operation then proceeds to step 410 in which the pointer T is incremented. If it was determined at step 408 that T is not equal to 0 and that the cost of the currently considered table is not less than MINCOST, then operation by-passes step 409 and proceeds directly to step 410. After step 410, it is determined at step 411 whether the table pointer T is equal to the number of tables. If not, operation loops back to step 407 and steps 407–411 are repeated using another Huffman table. If T is equal to the number of tables, the search for the best table for the current frame is considered finished, with the best table being indicated by the variable BESTTABLE.

Figure 5A:
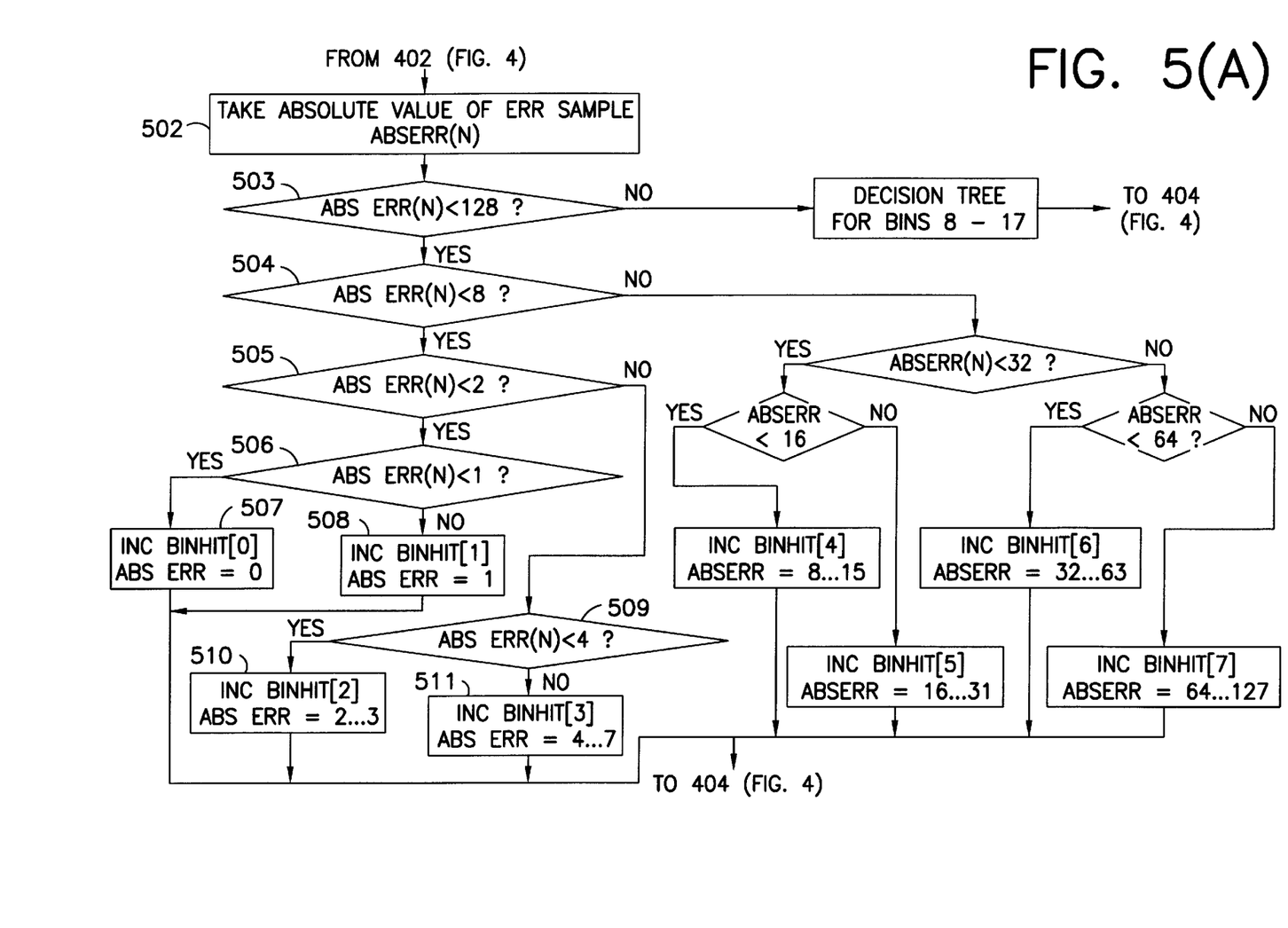
FIGS. 5(A) and 5(B) are flow-charts of two method for determining the distribution of prediction error values over a frame of audio data.

FIG. 5(A) is a flow-chart of a first alternative procedure for carrying out step 403, described above, in which the bin in which the current error sample value falls is determined. At step 502, the absolute value of the current error sample value, ABSERR, is determined. At steps 503–506, ABSERR is successively compared to the threshold values 128, 8, 2 and 1. If any of these comparisons yields a negative response, i.e., ABSERR is not less than the respective threshold, ABSERR is then compared to a threshold value that is mid-way between the current threshold value and the next highest threshold value. As such, as illustrated in FIG. 5(A), if in step 505 it is determined that ABSERR is not less than 2, the procedure branches to step 509 in which ABSERR is compared to 4, a value that is half-way between the current threshold value 2 and the next highest threshold value 8. If in step 509 it is determined that ABSERR is less than 4, it is concluded in step 510 that the error sample falls in the third bin, the bin for the values 2 and 3 and the binhit counter of the third bin is incremented. Operation then returns to the procedure of FIG. 4, continuing with step 404.

If a comparison yields an affirmative result, however, ABSERR is compared to a threshold value that is half-way between the current threshold value and the next lowest threshold value. This is illustrated in FIG. 5(A) by the decision branch following a determination in step 504 that ABSERR is not less than 8. For the sake of clarity, the complete decision tree for the case in which ABSERR is not less than 128 has not been shown in FIG. 5(A) but is readily deducible from the above description. It should be noted, however, that an extra comparison needs to be performed in the case where ABSERR is not less than 16384 in order to determine whether the error sample falls in the last bin (the bin for −32768) or the second to last bin (the bin for 16384 to 32767).

If the results of the comparisons of steps 503–505 are all affirmative, step 506 is reached. In step 506, if it is determined that ABSERR is less than 1, then the determination is made in step 507 that the error sample falls in the first bin, i.e., the bin for 0, and the binhit counter for the first bin is incremented. From this point, operation returns to the procedure of FIG. 4 and continues with step 404. If, however, it is determined in step 506 that ABSERR is not less than 1, then it is concluded in step 508 that the error sample falls in the second bin (the bin for 1) and the binhit counter for the second bin is incremented. Of course, unlike the general case discussed above, even though the comparison in step 506 yielded a negative response, there is no need for any further comparisons.

It can be shown that the procedure of FIG. 5(A) ensures that the bin of the current error sample is found in exactly 4 comparisons in all cases except the rare case in which the absolute value of an error sample is greater than or equal to 16384, in which case 5 comparisons are required. The substantial independence of the number of instructions needed to carry out the bin search procedure from the value of each error sample is an advantageous feature in executing the encoding method of the present invention in real time.

Figure 5B:
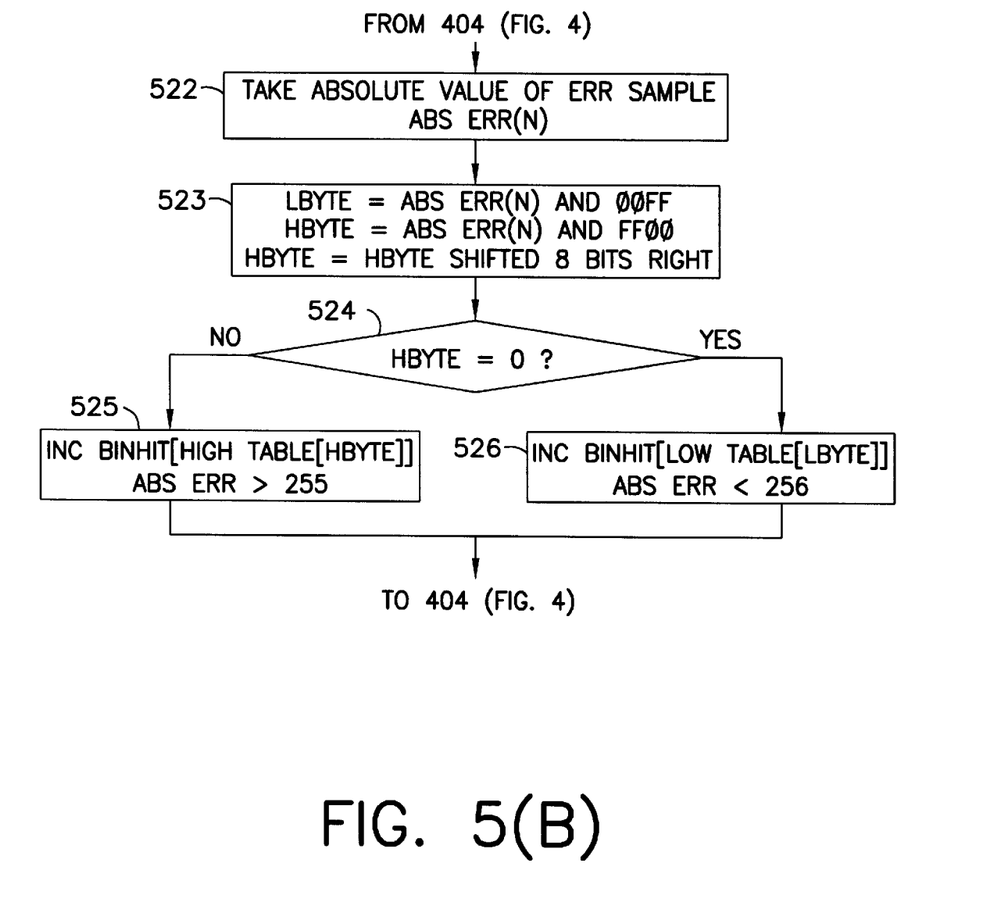

FIG. 5(B) is a flow-chart of a second alternative procedure for carrying out step 403, described above. The procedure of FIG. 5(B) combines the dichotomic and brute force approaches by limiting the number of comparisons to only one, but requiring the use of two small look-up tables. The procedure begins at step 522 by determining the absolute value, ABSERR, of the current error sample. At step 523, the 16-bit ABSERR value is parsed into two parts: LBYTE, the lower byte of ABSERR and HBYTE the upper byte of ABSERR. At step 524, HBYTE is compared to 0. If it is determined that HBYTE is not 0, i.e., that ABSERR is greater than or equal to 256, operation proceeds to step 525 in which the bin in which ABSERR falls is obtained from a HIGH table. The HIGH table has 128 entries, one for each of the 128 possible values of HBYTE, which indicate which one of the upper 8 bins ABSERR falls into, given the value of HBYTE. The bin hit counter of the bin determined from the HIGH table is incremented and operation returns to step 404.

If, however, it is determined at step 524 that HBYTE is zero, i.e., that ABSERR is less than 256, operation proceeds to step 526 in which the bin in which ABSERR falls is obtained from a LOW table. The LOW table has 256 entries, one for each of the 256 possible values of LBYTE, which indicate which one of the lower 9 bins ABSERR falls into, given the value of LBYTE. The bin hit counter of the bin determined from the LOW table is incremented and operation returns to step 404.

Another alternative scheme for carrying out the bin search procedure of step 403 would be to use a look-up table with 32768 entries indicating to which bin each of the 32768 possible absolute values belongs. Although this scheme would be fast, it would consume substantial memory. Yet another alternative for carrying out the bin search procedure of step 403 would be to compare the absolute value of each error sample with successively increasing powers of 2 until the first power of 2 greater than or equal to the sample value is found. This power of 2 is the upper boundary of the bin in which the error sample lies. A drawback with this approach is that up to 17 comparisons are required in the worst case where the absolute value of the error sample is 32768.

It should be readily apparent how to modify the above-described schemes for operation with 8, 18, 20 or 24-bit error sample values.

Figure 6:
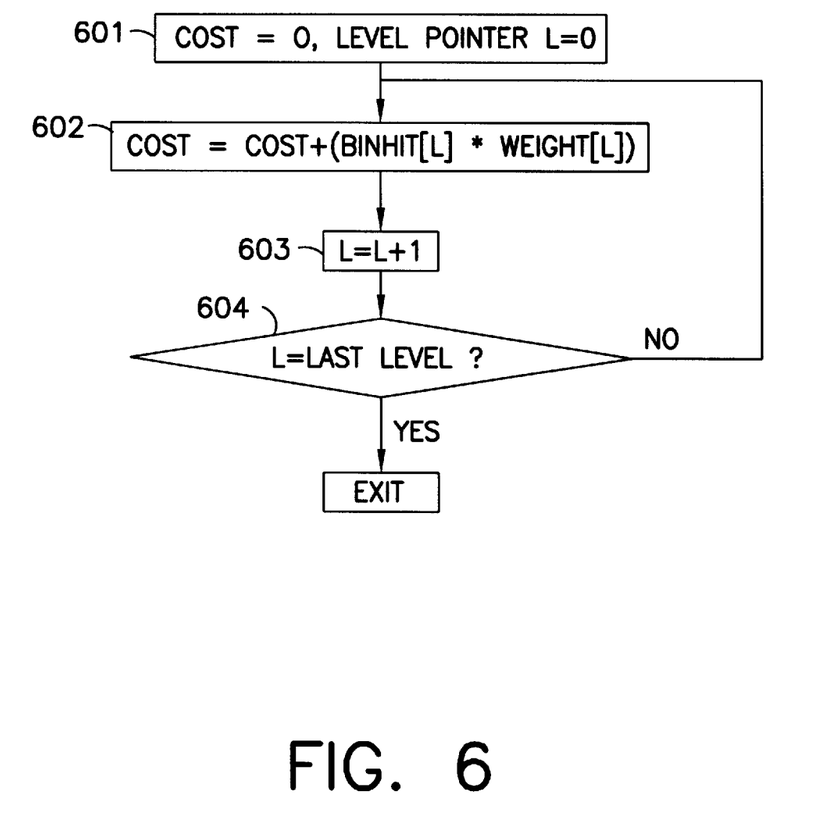
FIG. 6 is a flow-chart of a method for determining the coding cost of encoding a frame of audio data using a particular Huffman encoding table.

FIG. 6 is a flow-chart depicting a procedure for carrying out step 407, in which, as described above, the coding cost of coding the current frame of error samples is determined for a given Huffman table. At step 601, a variable COST and a bin pointer L are initialized to zero. The variable COST represents the total coding cost, in terms of coded bits, using the Huffman table currently under consideration. In step 602, the actual coding cost is determined for each bin in the Huffman table currently under consideration. The coding cost for each bin is equal to the number of error samples falling within the bin, i.e., the bin hit count for that bin, as determined above, multiplied by the weight of the bin. The weight of a bin is equal to the total number of bits (i.e., prefix+suffix) required to encode each error sample falling within the bin. The weight for each bin of each Huffman table is stored in the compact Huffman weight tables 105, discussed above. A weight table is stored by the encoder for each of the 15 Huffman code tables. Each weight table includes a 1-byte weight for each Huffman table entry. As such, the Huffman weight tables occupy 255 bytes of memory (15 tables×17 entries×1 byte/entry). The weight tables can either be stored and indexed apart from the Huffman code tables or combined with the Huffman code tables. The weight tables can be further compacted, since only 5 bits are required for each weight.

At step 602, the variable COST, representing the total cost for the table under consideration, is incremented by the cost of the bin currently under consideration. Step 602 is followed by step 603 in which the bin pointer L is incremented by one. At step 604, if it is determined that the bin pointer L is equal to the number of the last bin (i.e., 17, in the exemplary embodiment), the costs for all bins of the table currently under consideration table have been determined and operation returns to step 408. If the bin pointer has not yet reached the last bin, operation loops back to step 602 and steps 602–604 are repeated for the next bin in the table currently under consideration.

In an alternative embodiment of the present invention, the best table selector 103 can select Huffman tables on the basis of standard deviation. In such an embodiment, the best table selector 103 determines the standard deviation of the prediction error for each frame of samples. As can be seen in the Appendix, each table has associated with it a standard deviation (or "sigma"). Each table is designed to provide the most efficient coding for a frame of error samples exhibiting the associated standard deviation. The best table selector 103 then searches through the Huffman tables for the table which best matches the probability density function model for the given frame of error samples; i.e., the table whose associated standard deviation is the closest to the standard deviation for the given frame.

Unlike other audio signal compression methods and apparatus, such as those based on the MPEG standard, the lossless method and apparatus of the present invention will provide a variable compression ratio with an encoded bitstream that will vary in length from frame to frame. In accordance with the present invention, each frame of uncompressed audio data will be compressed into blocks of encoded data of varying size which blocks are organized so as to facilitate their random access.

Figure 7:
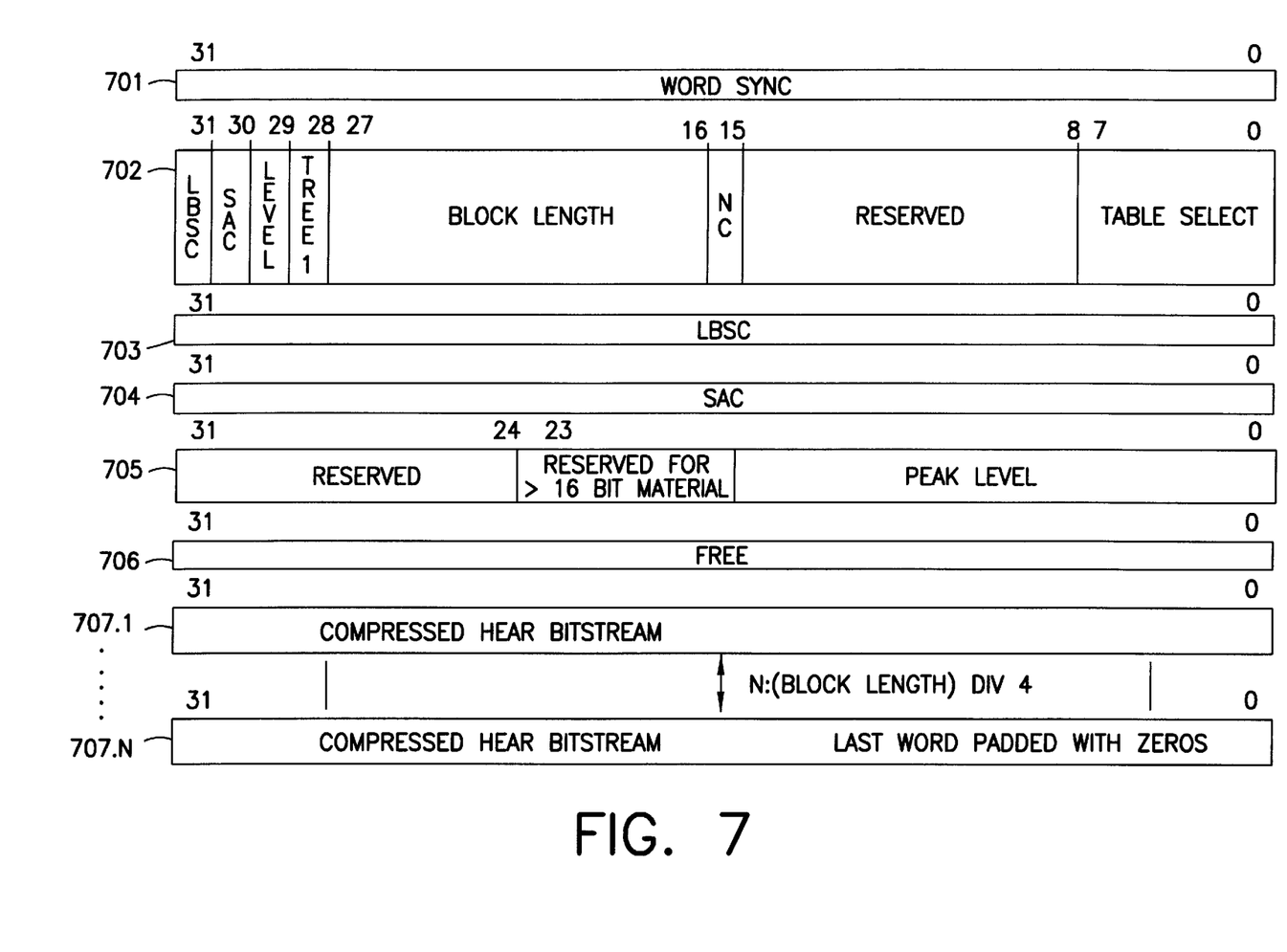
FIG. 7 shows the organization of compressed audio information in accordance with the present invention.

FIG. 7 shows the organization of a block of compressed audio data in accordance with the present invention. Each block of encoded data includes a header comprising up to six 32-bit words 701–706 and N 32-bit words 707.1–707.N comprising a bitstream of compressed data. Each header includes at least two 32-bit words, namely words 701 and 702.

The first 32-bit word 701 in the block header comprises a SYNC pattern having a value of 0xFFFFFFFF; i.e., 32 consecutive "1" bits. No combination of code words in the encoded bitstream can yield such a pattern. In accordance with the present invention, no combination of encoded prefixes and suffixes can yield a pattern with more than 29 consecutive "1" bits. This feature can be used to resynchronize the decoder in the event that the encoded data has been corrupted during storage or transmission. The decoder of the present invention scans the bitstream of encoded data until it has detected 32 consecutive "1" bits. From this point, valid encoded samples can be expected to follow after exactly 2 to 5 32-bit words. In accordance with the block organization of the present invention, any bit error within a block is localized to that block with no propagation of the error further down the bitstream of encoded audio data.

The second 32-bit word 702 in the block header includes information used in decoding the encoded data. Bit 31 of the word 702 indicates whether a Last Block Sample Count (LBSC) is present in the current block. If the LBSC is present, it is included as the third header word 703. The LBSC, which indicates the number of samples in the last block of a series of blocks of encoded data, is included only in the last block and then only if the original uncompressed data is not an exact multiple of the frame size. Therefore, for example, if the frame size is 1152 samples and the original uncompressed data is 2000 samples, the compressed data will include a first block with no LBSC and a second block with an LBSC with a value of 848. It should be apparent that the LBSC can take on any value from 1 to the frame size minus 1.

Bit 30 of the word 702 indicates whether a Sample Address Count (SAC) is included in the current block. If the SAC is present, it is included in the 32-bit word 704, which can either be the third or fourth 32-bit word of the header, depending on whether the header includes a word 703. The SAC can be optionally used to identify the samples in a block with a specific numbering scheme. With the audio samples numbered sequentially, the SAC is the number of the first sample in the block. The SAC can be used to provide a 24-hour time code for each block of audio data. Using all 32 bits of word 704 for the SAC, and assuming an audio sampling rate of 48,000 samples per second, the SAC can be used to represent up to 24.85 hours of audio data. Furthermore, in conjunction with a BLOCK LENGTH field, discussed below, the SAC allows a program to quickly access specific samples in a file of compressed audio data. Without such information, random access to a given sample within a file would require scanning the entire file or providing an additional index file.

Bit 29 of the word 702 indicates whether a LEVEL word is included in the current block. The LEVEL word is a 16-bit word that is optionally included in the 32-bit word 705, which can be the third, fourth or fifth 32-bit word in the header, depending on whether the header also includes words 703 and/or 704. The LEVEL word can be used to indicate the peak level, RMS level, or any other level information pertaining to the current block. The LEVEL word allows a program which displays the audio waveform, or which needs to determine the peak level reached in a file or part of a file, or which needs access to level information for any reason to do so without having to first decode the compressed audio information. As such, the LEVEL mechanism can increase the responsiveness of such a system by several orders of magnitude, especially when dealing with long audio files. In accordance with the preferred embodiment, the LEVEL information is not included in a block if it is determined to be a digital mute, in which case such information would be superfluous.

Bit 28 of the word 702 indicates whether an optional FREE word is included in the block as the 32-bit word 706 which can be the third, fourth, fifth or sixth 32-bit word in the header, depending on whether the header also includes words 703, 704 and/or 705. The FREE word is available for additional, as of yet undefined information which could be included in each block in the future.

Bits 16–27 of the word 702 includes a BLOCK LENGTH field which indicates the size of the current block in bytes, or the number of bytes until the next block header. The BLOCK LENGTH field allows quick browsing within a file of compressed audio data by making it possible for a program to quickly jump from one block to the next without having to read through all of the data in a block in search of the next SYNC pattern. The BLOCK LENGTH field can also be extended to allow for fast bidirectional browsing by also indicating the size of the preceding block or the number of bytes to the start of the SYNC pattern of the preceding block. Assuming a worst case in which no compression occurs, the 12 bits of the BLOCK LENGTH field can be used to code frames of up to 4096 bytes (i.e., 2048 16-bit audio samples). It should be readily apparent that the contents of the BLOCK LENGTH field can be expressed in units other than bytes, e.g., 16 or 32-bit words, especially since in accordance with the preferred embodiment of the present invention, blocks are padded to end on 32-bit boundaries.

The method and apparatus of the present invention makes provision for the case in which a frame of audio data samples are all zero (the "digital mute" condition). Such a case is indicated by a BLOCK LENGTH of zero. Moreover, as discussed above, during a digital mute condition the LEVEL field is not included, as indicated by bit 29. This advantageously leads to a very compact representation for mute blocks, which afterall can occur quite frequently in a stream of audio data. Each digital mute block typically consists of only the 32-bit header words 701 and 702 but can, however, also include 32-bits words 703 (LBSC) and/or 704 (SAC).

Bit 15 of word 702, the Not Compressed (NC) bit, indicates whether the audio sample contents of the block represent compressed or non-compressed data. The NC bit is used to ensure that in the event data, such as white noise or computer data that cannot appropriately be compressed, is input to the encoder of the present invention, the encoded block size will not be greater than the unencoded input data plus the block header overhead. Blocks of uncompressed data may still include words 703, 704, 705 and/or 706, as described above. The encoder of the preferred embodiment of the present invention decides whether to output data in the compressed or non-compressed form after completing the procedure of FIG. 4 by comparing the value of MINCOST resulting from step 408 to the cost of representing the frame in non-compressed form. If MINCOST exceeds the non-compressed cost, the encoder outputs the current block with audio data in the non-compressed form.

For input data that cannot properly be compressed, in an alternative embodiment of the encoder of the present invention, a special, sixteenth Huffman table, included in the Appendix with index number 15, is used to encode the input data. Huffman table no. 15 corresponds to the case in which the PDF of the prediction error for the current frame is flat, i.e., all samples have the same probability of occurrence. Using Huffman table no. 15, all samples, except for the −32768 value which is encoded with 17 bits, are encoded with their original length, e.g., 16-bit quantized audio samples are encoded as 16-bit coded samples. As with the other tables, encoding the input data using Huffman table no. 15 would also ensure that no bit pattern matching the SYNC pattern will occur.

Bits 8–14 of word 702 are reserved for yet undefined future uses. For example, these bits can be used to indicate what predictor was used in generating the block of compressed audio data.

Bits 0–7 of word 702, the TABLE SELECT field, identify the Huffman table that was used to encode the current block of audio data. With this information, the decoder can decode the compressed audio data using the same table. In the preferred embodiment, 15 Huffman tables are used, so that only 4 bits are required to identify each table. Using 8 bits for the TABLE SELECT field allows for further expansion in which additional Huffman tables would be required, as in the case of 18, 20 or 24-bit quantized audio or other improvements.

If the current block represents a digital mute condition, the header of the next block immediately follows the header of the current block. Otherwise, the compressed audio bitstream, organized as 32-bits words 707.1 to 707.N, follows the header of the current block. The last 32-bit word 707.N is padded with zeros so as to align the SYNC pattern of the next header on a 32-bit boundary.

Any of the above-described items of information included in each block header can alternatively be stored in a separate index file. Thus instead of being distributed throughout a file with encoded data, the header information is available at one centralized area. The use of an index file allows a program to fetch any such relevant information in a compact structure.

In an exemplary embodiment, the index file includes a sequence of modified block headers corresponding to the headers in a file of blocks of encoded audio data. Each modified block header in an index file has no SYNC word, no TABLE SELECT field and no LBSC word. The SAC and LEVEL information may still be optionally included. Moreover, since there is no need for fields such as the TABLE SELECT field, the BLOCK LENGTH field can be longer. The longer BLOCK LENGTH field can be advantageously used to store a cumulative block length indicating the offset of the respective block from the start of the audio file. This feature would make it unnecessary for a device using the audio data to perform the addition of block lengths in order to find the location of a block relative to the start of the audio file.

What is claimed is:

1. A method of encoding audio data comprising the steps of:

generating a frame of prediction error samples from a frame of audio data samples;

determining the cost of coding the frame of prediction error samples using each of a plurality of code tables, said plurality of code tables each corresponding to a different probability density function of a distribution of the prediction error samples;

determining which one of the plurality of code tables will provide the lowest cost of coding the frame of prediction error samples; and coding the frame of prediction error samples using the one of the plurality of code tables providing the lowest cost of coding the frame of prediction error samples.

2. The method of claim 1, wherein the cost of coding the frame of prediction error samples includes the number of bits used to represent the encoded frame of prediction error samples.

3. The method of claim 1, further comprising the step of forming a block of encoded audio data by adding a header to the frame of encoded prediction error samples.

4. The method of claim 3 further comprising the step of forming an index file, the index file including block length and level information for each of a plurality of blocks of encoded audio data.

5. The method of claim 3, wherein the header includes a sync word, a block length and a table select field.

6. The method of claim 5, wherein the sync word is comprised of a bit pattern that is different from any possible sequence of encoded prediction error samples.

7. The method of claim 5, wherein the header further includes a peak value field which includes a peak value for the frame of audio data samples.

8. A device for encoding audio data, comprising:

a predictor for generating a frame of prediction error samples from a frame of audio data samples;

means for determining the cost of coding the frame of prediction error samples using each of a plurality of code tables, the plurality of code tables each corresponding to a different probability density function of a distribution of the prediction error samples;

means for determining which one of the plurality of code tables will provide the lowest cost of coding the frame of prediction error samples; and a coder for coding the frame of prediction error samples using the one of the plurality of code tables providing the lowest cost of coding the frame of prediction error samples.

9. The device of claim 8, wherein the cost of coding the frame of prediction error samples includes the number of bits used to represent the encoded frame of prediction error samples.

10. The device of claim 8, further comprising a block encoder for forming a block of encoded audio data by adding a header to the frame of encoded prediction error samples.

11. The device of claim 10 further comprising means for forming an index file, the index file including block length and level information for each of a plurality of blocks of encoded audio data.

12. The device of claim 10, wherein the header includes a sync word, a block length and a table select field.

13. The device of claim 12, wherein the sync word is comprised of a bit pattern that is different from any possible sequence of encoded prediction error samples.

14. The device of claim 12, wherein the header further includes a peak value field which includes a peak value for the frame of audio data samples.

* * * * *